(12) United States Patent
Chen et al.

(10) Patent No.: US 9,768,080 B2
(45) Date of Patent: Sep. 19, 2017

(54) SEMICONDUCTOR MANUFACTURING APPARATUS AND METHOD THEREOF

(71) Applicant: TAIWAN SEMICONDUCTOR MANUFACTURING COMPANY LTD., Hsinchu (TW)

(72) Inventors: Jia-Jhen Chen, Taichung (TW); Sheng-Chen Wang, Taichung (TW); Feng-Inn Wu, Taichung (TW)

(73) Assignee: TAIWAN SEMICONDUCTOR MANUFACTURING COMPANY LTD, Hsinchu (TW)

( * ) Notice: Subject to any disclaimer, the term of this patent is extended or adjusted under 35 U.S.C. 154(b) by 84 days.

(21) Appl. No.: 14/133,130

(22) Filed: Dec. 18, 2013

(65) Prior Publication Data

US 2015/0170978 A1    Jun. 18, 2015

(51) Int. Cl.
*H01L 21/66* (2006.01)
*G01B 11/30* (2006.01)
*B24B 37/005* (2012.01)
*B24B 37/04* (2012.01)
*B24B 49/12* (2006.01)

(52) U.S. Cl.
CPC ............ *H01L 22/12* (2013.01); *B24B 37/005* (2013.01); *B24B 37/042* (2013.01); *B24B 49/12* (2013.01); *G01B 11/30* (2013.01); *H01L 22/26* (2013.01)

(58) Field of Classification Search
CPC ........... H01L 21/30625; H01L 21/3212; H01L 21/31053; H01L 21/02013; H01L 21/02024; H01L 22/26
See application file for complete search history.

(56) References Cited

U.S. PATENT DOCUMENTS

| 6,817,924 | B1* | 11/2004 | Lin | B24B 53/017 451/443 |
| 2004/0014401 | A1* | 1/2004 | Tsao | B24B 7/228 451/57 |
| 2009/0209175 | A1* | 8/2009 | Saito | B24B 49/12 451/6 |
| 2012/0315826 | A1* | 12/2012 | Lu | B24B 37/044 451/36 |

OTHER PUBLICATIONS

"Characterization of wet pad surface in chemical mechanical polishing (CMP) process with full-field optical coherence tomography (FF-OCT)" Woo June Choi,1 Sung Pyo Jung,2 Jun Geun Shin,1 Danning Yang,2 and Byeong Ha Lee1,Jul. 4, 2011 / vol. 19, No. 14/ Optics Express 13343, accepted Jun. 12, 2011; published Jun. 27, 2011.

* cited by examiner

*Primary Examiner* — Mohammad Choudhry
(74) *Attorney, Agent, or Firm* — WPAT, P.C., Intellectual Property Attorneys; Anthony King; Kay Yang

(57) ABSTRACT

A semiconductor manufacturing method includes several operations. One operation is catching an image of a predetermined location on a surface of a pad installed in a chemical mechanical polishing (CMP) apparatus by a surface detector. One operation is transferring the image of the predetermined location to a processor. One operation is calculating a surface roughness value of the predetermined location from the image. One operation is comparing the surface roughness value with a threshold value by the processor to determine if the surface roughness condition at the predetermined location is smaller than the threshold value, and the surface is configured for polishing a to-be-polished surface of a wafer.

14 Claims, 13 Drawing Sheets

SEMICONDUCTOR MANUFACTURING APPARATUS AND METHOD THEREOF

FIELD

The disclosure relates to a semiconductor apparatus and method thereof.

BACKGROUND

The semiconductor integrated circuit (IC) industry has experienced rapid growth. Between and during operation processes of manufacturing semiconductor wafers, chemical mechanical polishing (CMP) process has been used to remove unwanted material from semiconductor wafer surfaces.

A CMP apparatus includes a pad for polishing the semiconductor wafer. The pad and the semiconductor wafer are both rotated when in contact with each other. The roughness of the surface of the pad, the rotation speeds of the semiconductor wafer and the pad, and the relative pressure between the semiconductor wafer and the pad are factors that affect the polishing result, i.e., the planarization of the semiconductor wafer.

During the CMP process, the pad itself becomes smoother from the polishing. Therefore, it is necessary to have a reconditioning process to recreate the rough pad surface. CMP apparatus have pad conditioners to recondition the pads. The conditioner resurfaces the pad, removes the used slurry, and supplies the pad surface with fresh slurry. Ways to maintain the polish rate and uniformity is sought to improve the post CMP wafer quality.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
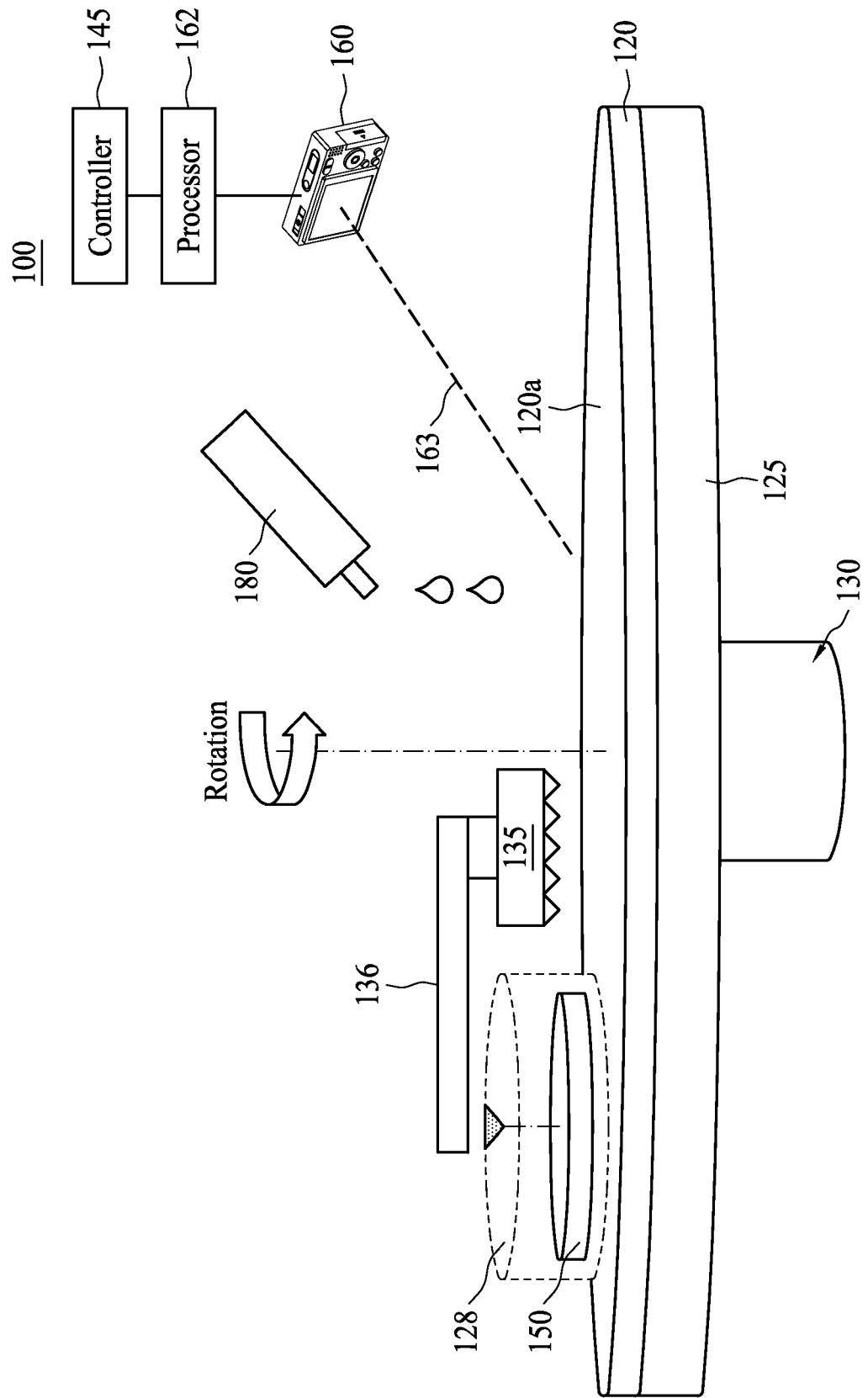
FIG. 1 is an apparatus used in chemical mechanical polishing (CMP) for fabricating a semiconductor wafer in accordance with some embodiments of the present disclosure.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention. It is to be understood that the following disclosure provides many different embodiments or examples for implementing different features of various embodiments. Specific examples of components and arrangements are described below to simplify the present disclosure. These are, of course, merely examples and are not intended to be limiting.

Further, it is understood that several processing steps and/or features of a device may be only briefly described. Also, additional processing steps and/or features can be added and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

In the present disclosure, a semiconductor manufacturing apparatus is designed to perform an in-situ pad roughness measurement. The roughness measurement is performed by a surface detector for detecting a real time surface roughness. The mean value and uniformity of surface roughness are generated by the apparatus when the tool is either idle or in a normal operation mode.

A surface reconditioning is also performed to increase the roughness in order to maintain polish rate to be above a predetermined threshold value. The result of surface roughness measurement is transmitted to a controller of the apparatus to determine the location to be reconditioned and amount of slurry to be dispensed.

In the present disclosure, there are several methods performed through the apparatus to conduct a CMP process. In some embodiments, the apparatus is further connected to a production management system in order to associate a post CMP wafer quality with the pad surface roughness.

FIG. 1 is an apparatus 100 used in chemical mechanical polishing (CMP) for fabricating a semiconductor wafer. In some embodiments, the apparatus 100 is a semiconductor manufacturing tool to remove material from a wafer after deposition. The apparatus 100 has a pad 120 attached on a platen 125. While performing CMP on a wafer 150, the wafer 150 is retained in a polish head 128 and pushed by the polish head 128 to be against a surface 120a of the pad 120. The platen 125 is driven by a motor (not shown) to rotate the pad 120 along a shaft 130, thus the wafer 150 is polished by the pad 120 accordingly. In some embodiments, the polish head 128 spins to rotate the wafer 150 during a CMP operation.

The surface 120a is an uneven surface with properties such as roughness and groove depth which are factors that affect the polish rate on a wafer surface. For roughness, there are several parameters adopted to measure the degree of the roughness, roughness average (Ra) is used in the present disclosure. The definition of Ra is defined as the average of absolute deviation from the height mean value (Rm) within an area and commonly adopted as a measurement in the field. The Ra of the whole area of surface 120a of the pad 120 is defined as a global Ra, or called GRa, however, the Ra of a portion of the whole area of surface 120a is defined as a localized roughness, or called LRa in the present disclosure. A surface with a greater Ra indicates that the surface is more rough or uneven in comparison with a surface with a smaller Ra.

Besides GRa, another parameter to characterize the surface profile of the pad 120 is the uniformity of the Ra, or called roughness uniformity, $U_R\%$, in the present disclosure. To calculate $U_R\%$, a first step is to categorize the pad surface 120a into several independent zones, and then measuring LRa of each zone. A formula to define the $U_R\%$ is described as follows:

$$U_R\% = \frac{\text{Max}(LRa) - \text{Min}(LRa)}{\text{Mean}(LRa)} \times 100\%$$

The Max (LRa) is the LRa of the zone with the greatest LRa among all independent zones. The Min (LRa) is the LRa of the zone with the smallest LRa among all independent zones. The Mean (LRa) is the mean value of the LRa of all independent zones.

The average polish rate of the pad is related to the degree of roughness of the surface 120a. A pad surface with a high degree of roughness provides more pores for accommodating abrasive slurry during polish, therefore the friction force between the pad and wafer is high. The average polish rate decreases with the reduction of the GRa. In other words, when the profile of surface 120a becomes smoother, the average polish rate declines. Similarly, each zone on the pad surface 120a has a corresponding localized polish rate and the localized polish rate decreases with the reduction of the LRa.

A surface defector 160 is installed adjacent to the pad 120 with a distance. The surface detector 160 is used to detect a surface roughness condition of the pad surface 120a. In some embodiments, the surface detector 160 is an optical detector and includes a light emitter (not shown) and an optical receiver (not shown). As in FIG. 1, the surface detector 160 includes a laser source emitting an incident light 163 onto the surface 120a. The light emitter is able to move the light beam around the pad surface 120a and conduct either surface scan or line scan. An arrangement for the scan pattern is adopted if a predetermined location on the surface 120a is required to be scanned and detected. In some embodiments, the surface detector 160 is attached in a chamber next to the pad and swings above the surface 120a while detecting the surface profile of the surface 120a. When reaching the surface 120a, the light 162 is scattered or reflected by the surface 120a. The receiver collects the optical signal reflected from the surface 120a. The surface profile of the pad 120 is measured through the reflected optical signal.

In some embodiments, the surface detector is not equipped with a light emitter and receiver. For example, the surface detector 160 is a charge coupled device (CCD) and able to catch the image of the pad surface 120a without an aid of a light emitter. In some embodiments, the surface detector 160 is a confocal laser scanning microscopy (CLSM), or vertical scanning optical interferometry (VSOI).

The surface detector 160 further has a converter to convert the analog optical signals into electrical signals. The converter is coupled with the surface detector 160 and stores an algorithm to process the electrical signals for generating a roughness value of the location detected. In some embodiments, the converter is built in the surface detector 160.

The surface detector 160 is integrated in the apparatus 100 and the scanning operation is performed under a real time mode without switching the apparatus 100 offline. For example, the surface detector 160 is able to scan the pad surface 120a while a wafer is under polish. An in-line roughness is generated without interrupting the apparatus 100. Therefore, the surface detector 160 is able to perform a real time pad roughness monitor while the wafer is under polish. Even when the pad 120 is under rotation, the surface detector 160 can be disposed at a fixed location or angle and dynamically captures the image of the pad surface 120a.

In some embodiments, the surface detector 160 is in communication with a controller 145 of the apparatus 100, thus the surface detector 160 operates in accordance with the status of the apparatus 100. For example, when the apparatus 100 is in idle mode which means the pad surface 120 is free of wafer, the surface detector 160 receives an order from the controller 145 of the apparatus 100 to detect roughness condition of surface 120a. The angle or location of the surface detector 160 is adjusted by the controller 145 to capture image of a predetermined location.

In some embodiments, the surface detector 160 is configured to perform a full scan or a local scan. For the full scan, the surface detector 160 catches the image of whole area of surface 120a. For the local scan, the surface detector 160 only catches a predetermined location on the surface 120a. In some embodiments, the surface detector 160 is able to process the caught image and recognizes the roughness condition of surface 120a of a certain localized zone or location.

Figure 2A:
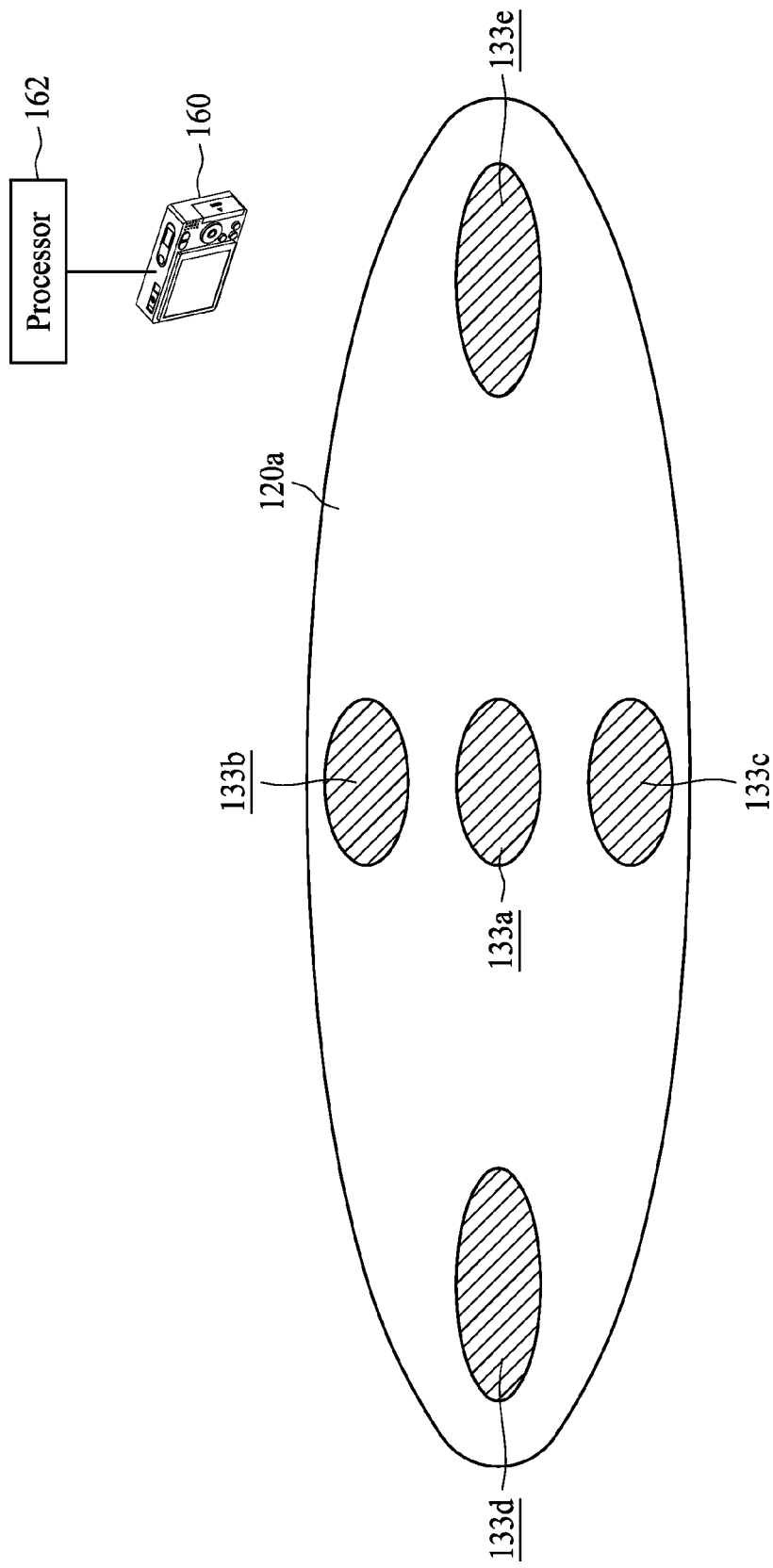
FIG. 2A is a CMP pad been categorized into five different zones in accordance with some embodiments of the present disclosure.

As in FIG. 2A, the surface detector 160 is able to recognize different zones on the pad surface 120a and detect localized roughness of each zone on the surface 120a. Several zones such as 133a~133e are defined on the pad surface 120a by the detector 160. A processor 162 is coupled with the surface detector 160 to calculate roughness of each zone according to the surface profile caught by the surface detector 160. In some embodiments, the processor 162 is built in the surface detector 160 as an integrated component. The surface detector 160 processes the caught image either from a full scan or a local scan and categorizes the image into several zones associated with corresponding zones 133a~133e defined on the pad surface 120a. The profile in each zone is calculated from the caught image by the detector 160 to realize LRa of each zone.

Figure 2B:
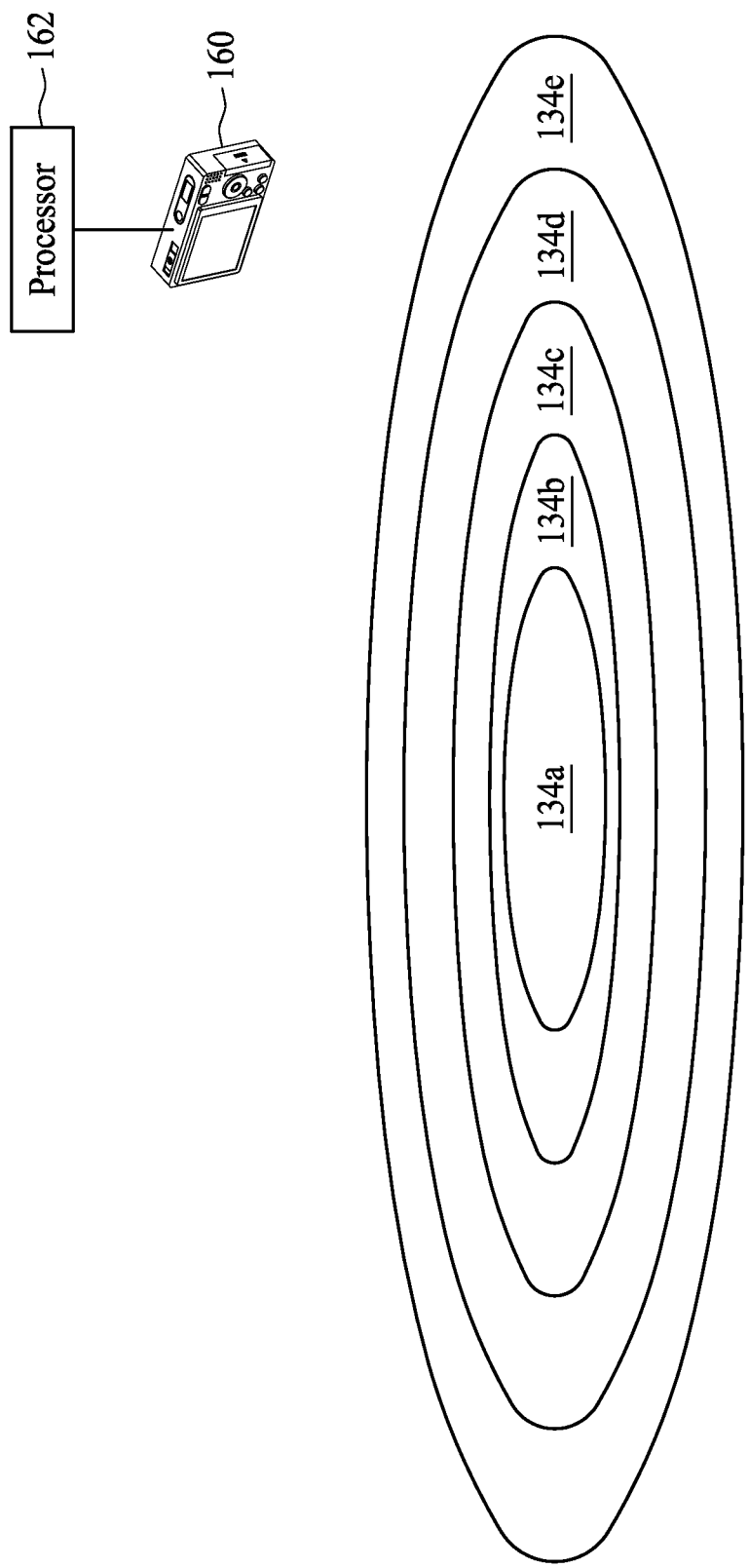
FIG. 2B is a CMP pad been categorized into five different zones in accordance with some embodiments of the present disclosure.

For some embodiments, the pad surface 120a is defined into different zones as in FIG. 2B. There are several zones 134a~134e that are concentric to the center of pad 120. Zone 134a is located close to the center and zone 134e is located at outermost. Besides zone 134a, other zones are concentric rings. Similar to FIG. 2A, the detector 160 detects localized roughness of each zone. The surface detector 160 processes the caught image either from a full scan or a local scan and categorizes the image into several zones associated with corresponding zones 134a~134e defined on the pad surface 120a.

Figure 3A:
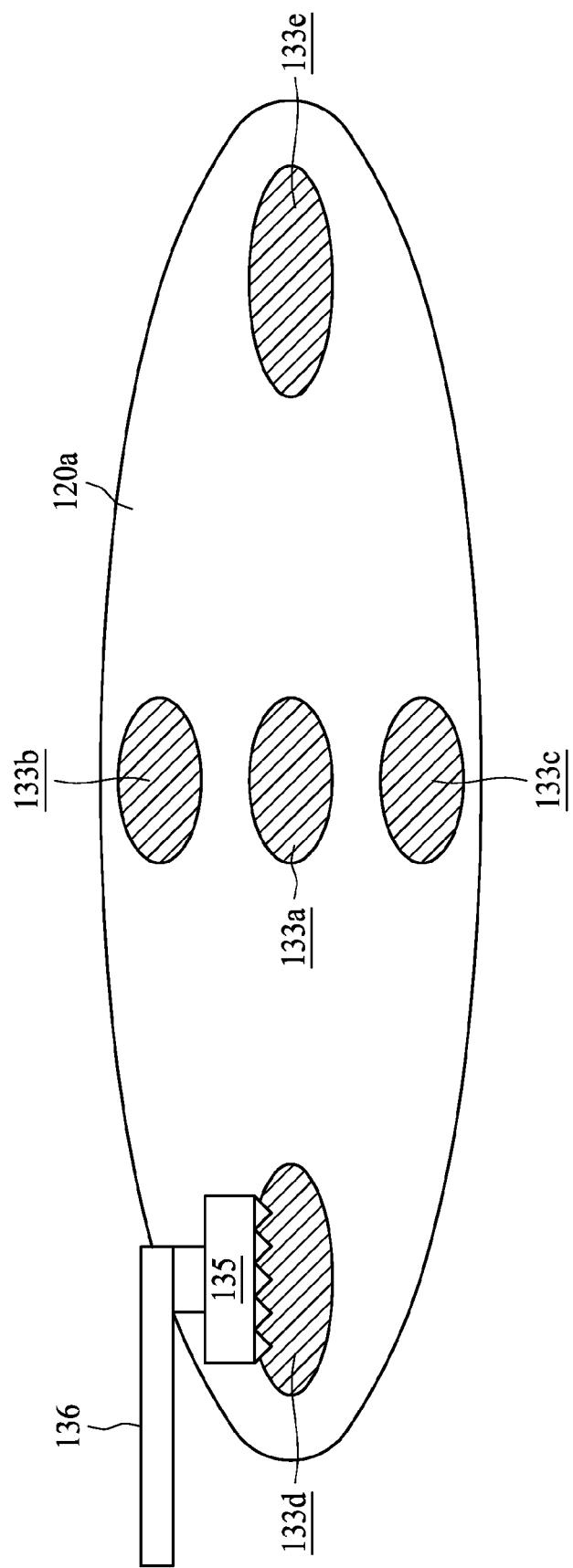
FIG. 3A is a CMP pad been categorized into five different zones and one of the five different zones is reconditioned in accordance with some embodiments of the present disclosure.
Figure 3B:
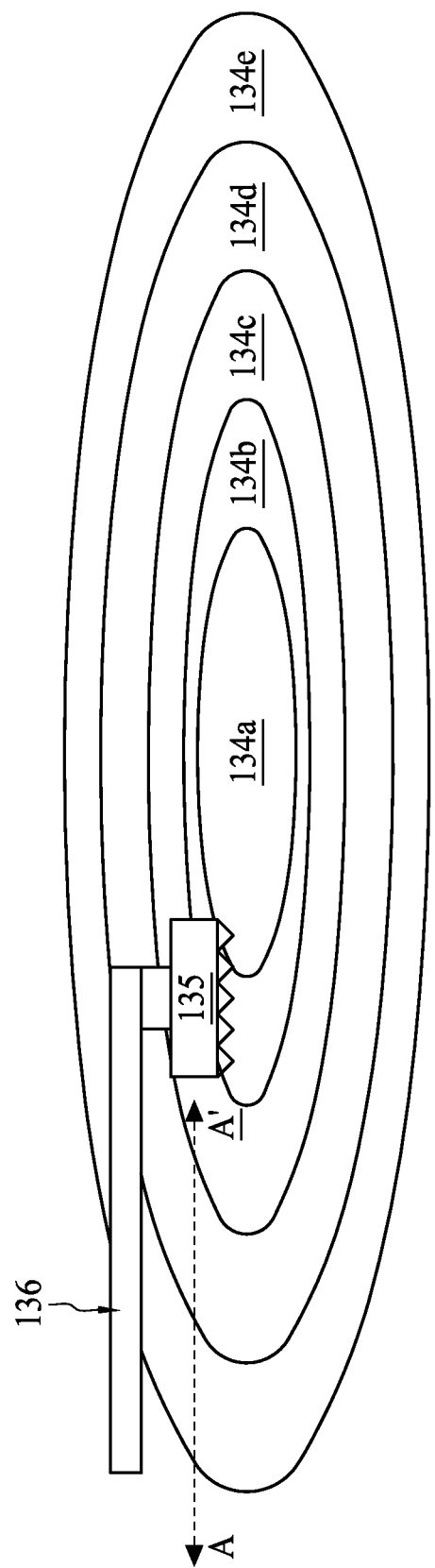
FIG. 3B is a CMP pad been categorized into five different zones and one of the five different zones is reconditioned in accordance with some embodiments of the present disclosure.

Referring back to FIG. 1, the apparatus 100 further has a conditioner 135. The conditioner 135 has metallic or diamond grit facing the surface 120a. When the conditioner 135 is lowered down to be against the pad 120, the metallic or diamond grit breaks up the surface 120a and increase the roughness average of the pad 120. The conditioner 135 is connected with an arm 136 which relocates the conditioner 135 to a designated position. The arm 136 makes a 3D move to lower down the conditioner 135 onto the surface 120a. In some embodiments, the arm 136 is controlled by the controller 145. As in FIG. 3A, the conditioner 135 is relocated by the arm 136 to be above zone 133d. The controller 145 further commands the conditioner 135 to touch zone 133d and conditions zone 133d. In some embodiments, the pad 120 rotates while the conditioner 135 touches the pad surface 120a. Therefore, the conditioner 135 roughens the pad surface 120a in a ring configuration. If the conditioner 135 is fixed at a certain location, a certain concentric zone such as 134b in FIG. 3B is conditioned accordingly. For some cases, the conditioner 135 is able to dislocate along a radius direction, such as line AA', and several concentric zones are conditioned by the conditioner 135.

Figure 4:
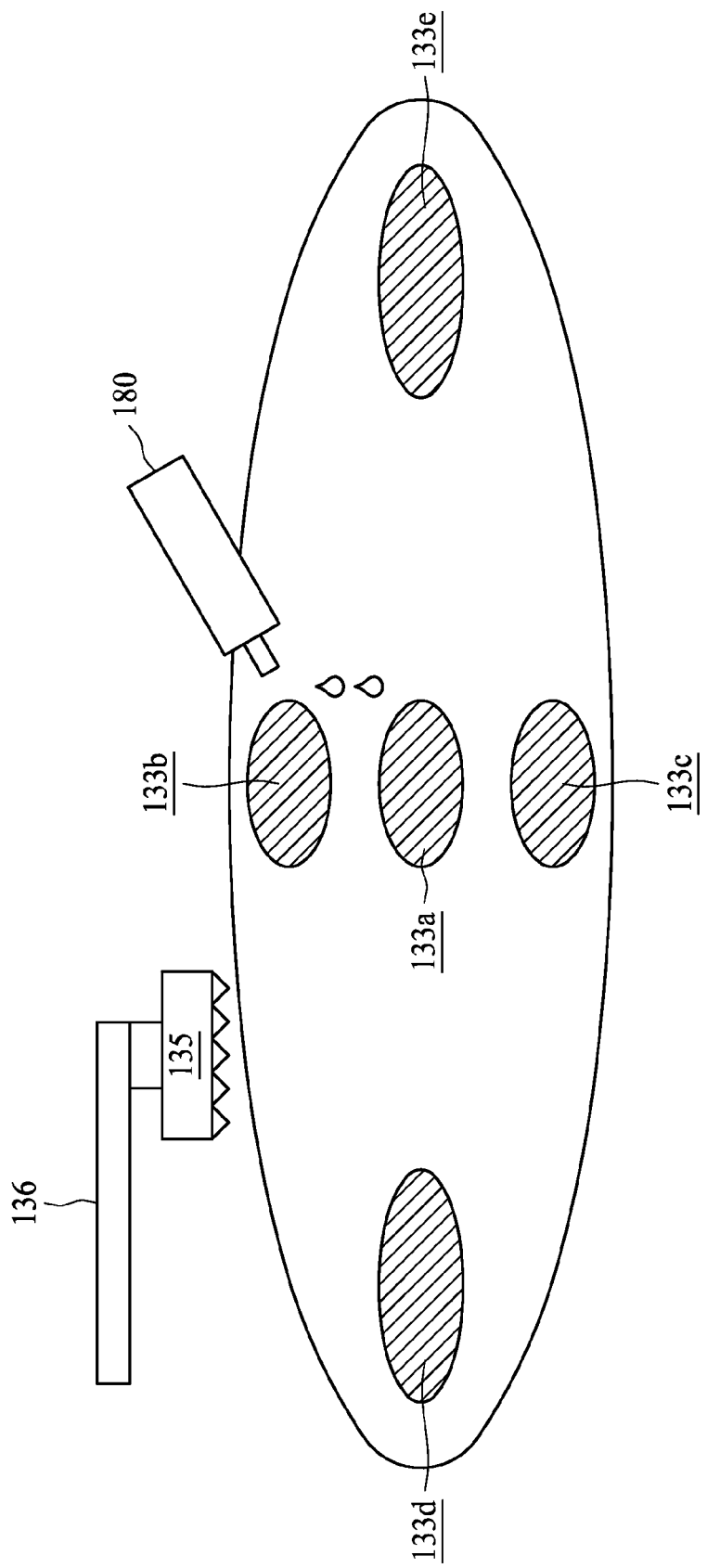
FIG. 4 is a CMP pad been categorized into five different zones and one of the five different zones is reconditioned with dispensed slurry in accordance with some embodiments of the present disclosure.

The apparatus 100 in FIG. 1 further has a slurry nozzle 180 for dispensing slurry on pad surface 120a. Similar to the conditioner 135, the nozzle 180 is also connected with an arm (not shown) which relocates the slurry nozzle 180 to a designated position. The position and slurry volume to be dispensed is respectively controlled by the controller 145. As in FIG. 4, the slurry nozzle 180 is relocated to be above zone 133a and a specified volume of slurry as requested by the controller 145 is dispensed from the nozzle 180 to fall on zone 133a. The slurry nozzle 180 is able to dispense various zones on the pad surface 120a.

In some embodiments, the controller 145 associates the processor 162 with the conditioner 135 and the slurry nozzle 180. The controller 145 is also configured to coordinate the slurry nozzle 180 and the conditioner 135. For example, when the controller 145 discovers that the center zone 133a is too smooth to achieve a polish rate meeting the spec, the controller 145 commands the arm connected with slurry nozzle 180 to relocate the slurry nozzle 180 to be above the center zone 133a. A certain amount of slurry is requested by the controller and dispensed on center zone 133a through the slurry nozzle 180. Subsequently, the controller 145 commands the arm 136 to relocate the conditioner 135 to be above center zone 133a and then lower the conditioner down to center zone 133a to be against center zone 133a and rough the surface.

Figure 5:
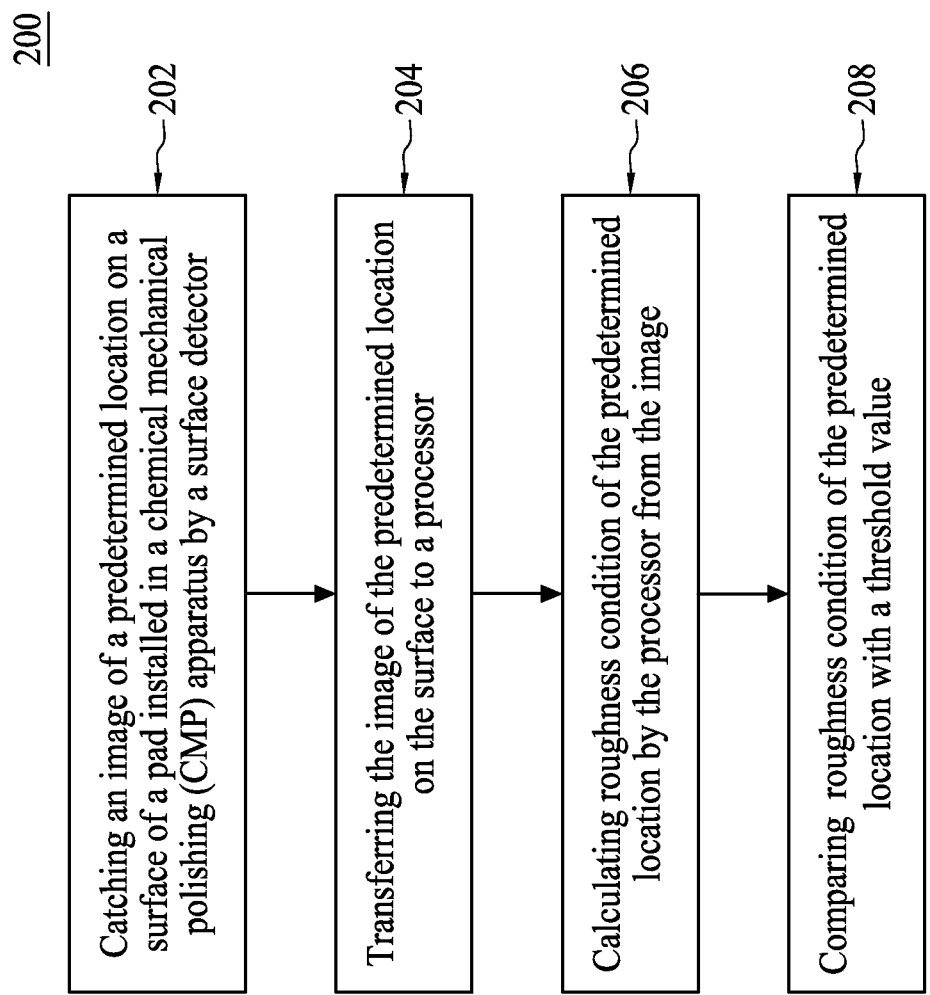
FIG. 5 is a flow chart of a method for fabricating a semiconductor wafer with a CMP apparatus as in FIG. 1 in accordance with some embodiments of the present disclosure.

FIG. 5 is a flow chart of a method 200 for fabricating a semiconductor wafer with a CMP apparatus 100 as in FIG. 1 in accordance with some embodiments of the present disclosure. The method 200 includes several operations and some of the operations can be skipped in certain embodiments. In operation 202, a surface image of the pad 120 is caught by the surface detector 160. Because the surface detector 160 is integrated in the CMP apparatus 100, the detection is under an in-situ mode without human intervention. The location to-be-detected on the pad surface 120a is predetermined by the controller 145. In some embodiments, the predetermined location is the center zone 133a in FIG. 3. In some embodiments, the surface detector 160 captures a snap shot image of the surface profile of the pad surface 120a. The snap shot image is transmitted to the processor 162 to recognize the predetermined location.

In operation 204, the image caught by the surface detector 160 is transferred to the processor 162. In operation 206, the processor 162 calculates the surface roughness value of the predetermined location from the image transferred from the surface detector 160. For example, a global roughness GRa of the total area of the surface 120a or a localized roughness LRa of a predetermined zone. In addition to the mean value of the roughness for the predetermined location, the processor 162 is also used to calculate the uniformity of the roughness for the predetermined location. Various sample sizes are available to determine the uniformity according to resolution as desired. For example, the image detector 160 catches image of the pad surface 120a and categorizing the image into five different zones as in FIG. 2. Then the processor 162 calculates a mean roughness value of each independent zone to provide five different mean roughness values, $LR_{133a}$, $LR_{133b}$, $LR_{133c}$, $LR_{133d}$, and $LR_{133e}$, for the pad 120. The largest and smallest value among the five mean roughness values and the average of the five mean roughness values are used to calculate the uniformity according to the aforementioned equation. In some embodiments, the processor 162 categorizes the image into nine different zones and uses nine mean roughness values to provide a nine-site roughness uniformity.

In some embodiments, predetermined location recognition and roughness condition calculation are performed simultaneously. The processor 162 is built in the surface detector 160 and the image transferring is performed inside the surface detector 160 without any external wire or wireless router.

The method 200 continues with operation 208 in which the roughness condition calculated in operation 206 is compared with a predetermined specification. The predetermined specification is defined for monitoring mean global roughness and as a threshold value that is correlated with a minimum polish rate as required for certain process. When the roughness condition calculated is less than the threshold value, the apparatus 100 is not allowed to perform wafer polishing. In some embodiments, the specification is defined to control the uniformity of the roughness and as a threshold value that is correlated with a polish rate uniformity of the pad 120.

Figure 6:
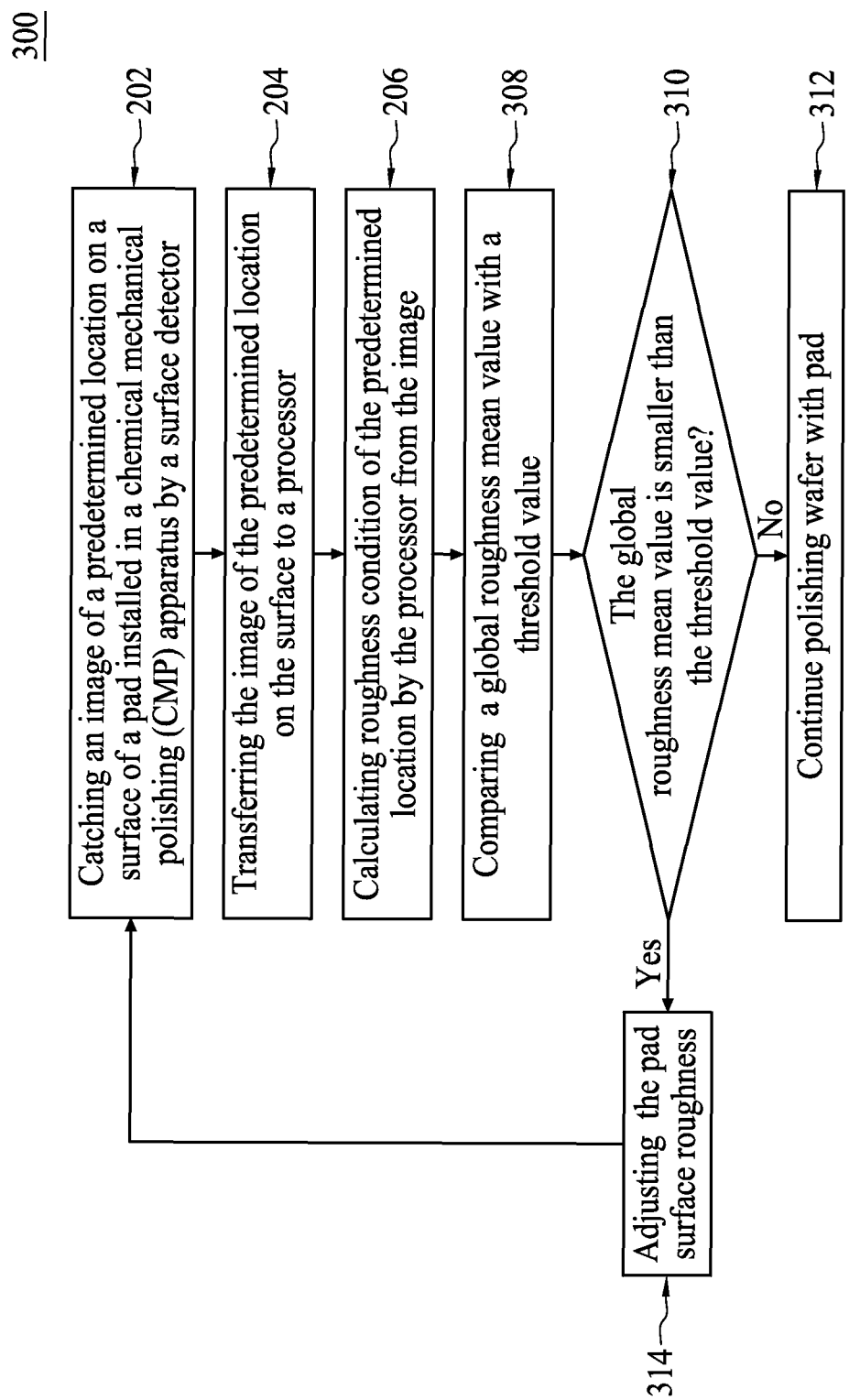
FIG. 6 is a flow chart of a method for fabricating a semiconductor wafer with a CMP apparatus as in FIG. 1 in accordance with some embodiments of the present disclosure.

FIG. 6 is a flow chart of method 300 for fabricating a semiconductor wafer with a CMP apparatus 100 as in FIG. 1 in accordance with some embodiments of the present disclosure. The method 300 has several operations and an operation with same number as described in the aforementioned embodiments will not be repeated herein. In method 300, operation 308 is an operation in which the global roughness mean value of pad surface 120a is compared with a threshold value. The threshold value is a minimum roughness required for pad 120 to perform CMP process.

In operation 310, a decision is performed according to the comparison result in operation 308. The method 300 continues to operation 312 if the global roughness mean value of pad surface 120a is greater than or equal to the threshold value. In operation 312, the controller 145 commands pad 120 to continuously polish wafer. In some embodiments, the pad roughness detection and calculation are performed when a wafer is under CMP process. Surface profile detection on pad 120 is performed without tool interruption.

The method 300 continues to operation 314 if the global roughness mean value of pad surface 120a is smaller than the threshold value. In operation 314, the surface roughness condition of pad 120 is adjusted. In some embodiments, the controller 145 commands the conditioner 135 to perform a global polish to recondition the surface 120a of whole area of pad 120. The global polish breaks up the surface 120a and increases the mean roughness value of the pad 120. Operation 202 in FIG. 6 is optional and performed after operation 314 to re-detect the surface roughness condition and verify effectiveness of the recondition performed in operation 314.

In some embodiments, the controller 145 sets the pad 120 in idle mode and requests maintenance. The apparatus 100 is stopped and logged into offline for an inspection. If the pad surface 120a is verified and confirmed that the grooves are worn out, a pad change is required in order to have a new pad surface which has a roughness value greater than the threshold value. Optionally, the surface condition of the new pad is detected and calculated by following a flow starting from operation 202 through 308 before a wafer is loaded on the new pad.

Figure 7:
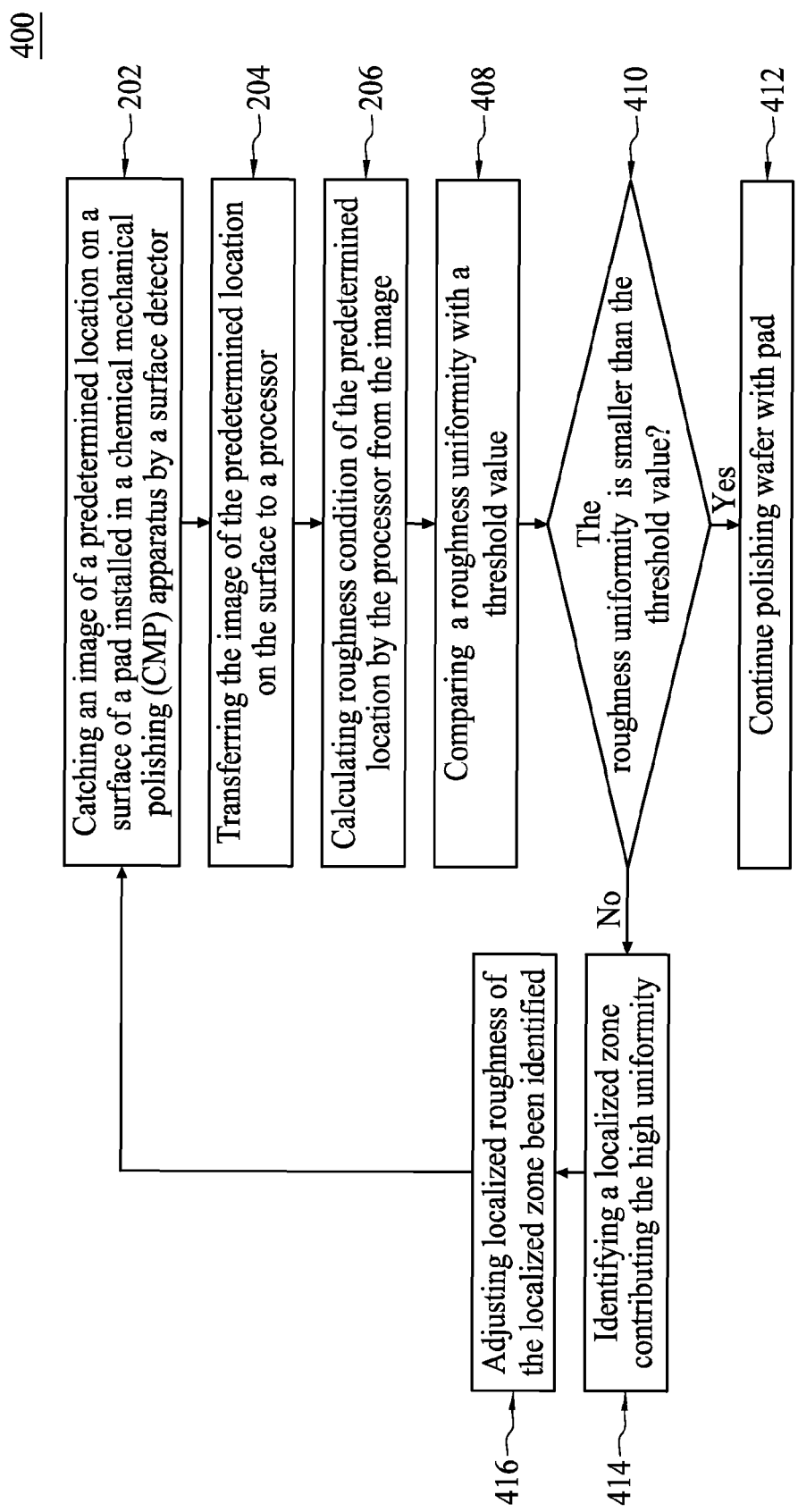
FIG. 7 is a flow chart of a method for fabricating a semiconductor wafer with a CMP apparatus as in FIG. 1 in accordance with some embodiments of the present disclosure.

In addition to control the global pad roughness mean value, the roughness uniformity of pad surface 120a is also monitored by the apparatus 100. FIG. 7 is a flow chart of method 400 for fabricating a semiconductor wafer with a CMP apparatus 100 as in FIG. 1 in accordance with some embodiments of the present disclosure. The method 400 has several operations and an operation with a same number as described in the aforementioned embodiments will not be repeated herein for simplification. In operation 408, the roughness uniformity of pad surface 120a is compared with a threshold value. The threshold value is a maximum uniformity value allowed to perform a CMP process by apparatus 100. If the roughness uniformity is greater than the threshold value, the post CMP profile of the wafer been polished by the pad 120 has a high uniformity. The high uniformity of post CMP profile affects the wafer quality and final product yield. For example, if the CMP process is followed by photolithography process, the photo resist thickness on a high uniformity post CMP varies across the wafer surface. When fixed exposure energy is applied on the photo resist, the final dimension of developed photo resist varies with the thickness deviation.

In operation 410, a decision is performed according to the comparison result performed in operation 408. The method 400 continues to operation 412 if the roughness uniformity of pad surface 120a is smaller than the threshold value. In operation 412, the controller 145 commands pad 120 to continuously polish wafer. In some embodiments, the pad roughness detection and calculation are performed when a wafer is under CMP process and there is no tool intervention required for performing the roughness value calculation.

The method 400 continues to operation 414 if the roughness uniformity of pad surface 120a is greater than or equal to the threshold value. In operation 414, the roughness of several localized zones are analyzed to identify which zone is the major contributor to the high roughness uniformity. For example, the pad surface 120a is categorized into five localized zones as in FIG. 4 and central zone 133a is identified to have a smallest roughness value compared with the other four zones.

In operation 416, surface condition of the localized zone identified in operation 414 is adjusted. In some embodiments, the controller 145 commands the conditioner 135 to perform a local polish to recondition the surface of the localized zone identified. The local polish breaks up the surface of the localized zone identified in operation 414 and increases the roughness value of the localized zone. During operations 416, the slurry nozzle 180 in FIG. 1 is also relocated to be above the identified zone and dispenses a certain amount of slurry on the identified zone. The slurry amount is adjustable according to the roughness value detected. Operation 202 in FIG. 7 is optionally performed after operation 416 to re-detect the surface roughness condition and verify effectiveness of the local recondition performed in operation 416.

In some embodiments, the controller 145 sets the pad 120 in idle mode and requests maintenance if the roughness uniformity is higher than a limit. The apparatus 100 is stopped and logged into offline for an inspection. If the pad surface 120a is verified and the grooves are confirmed been worn out, a pad change is required in order to have a new pad surface which has roughness uniformity smaller than the threshold value. Optionally, profile of the new pad surface is detected and calculated from operation 202 through 408 before a wafer is loaded on the new pad.

Figure 8:
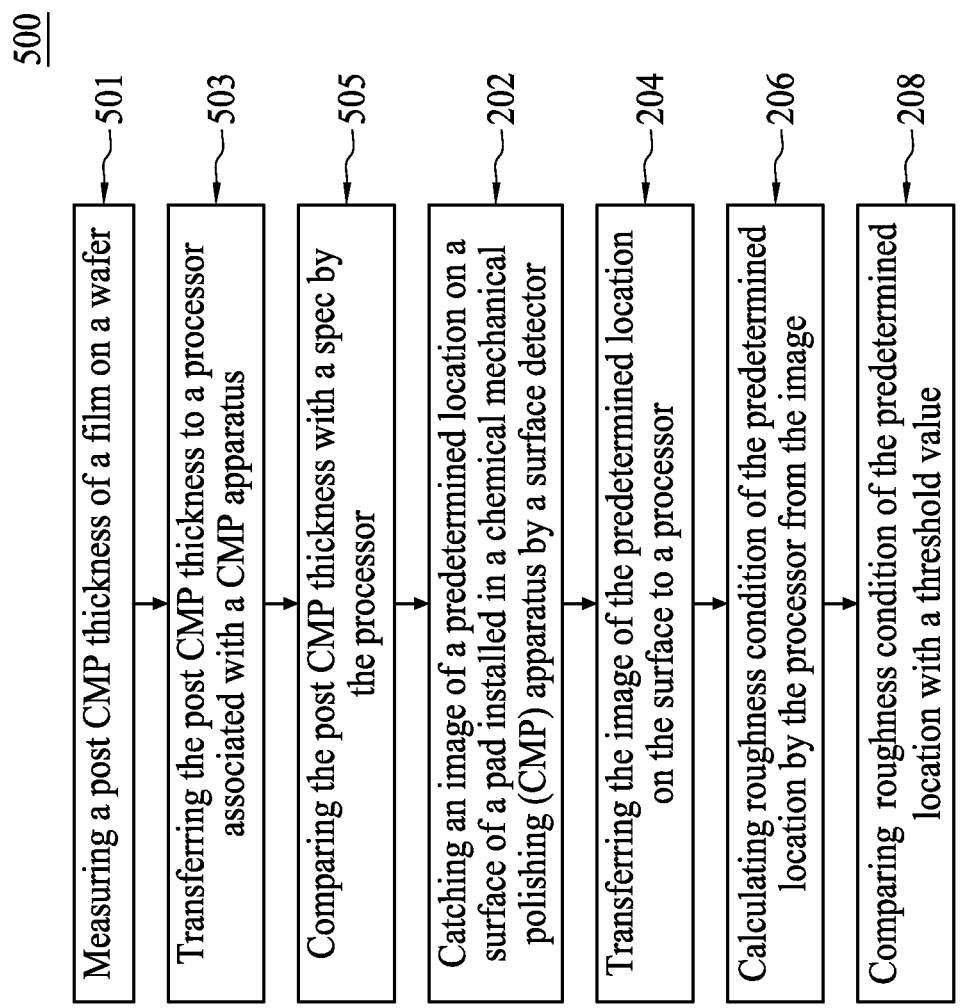
FIG. 8 is a flow chart of a method for fabricating a semiconductor wafer with a CMP apparatus in FIG. 1 connected to a production management system in accordance with some embodiments of the present disclosure.
Figure 9:
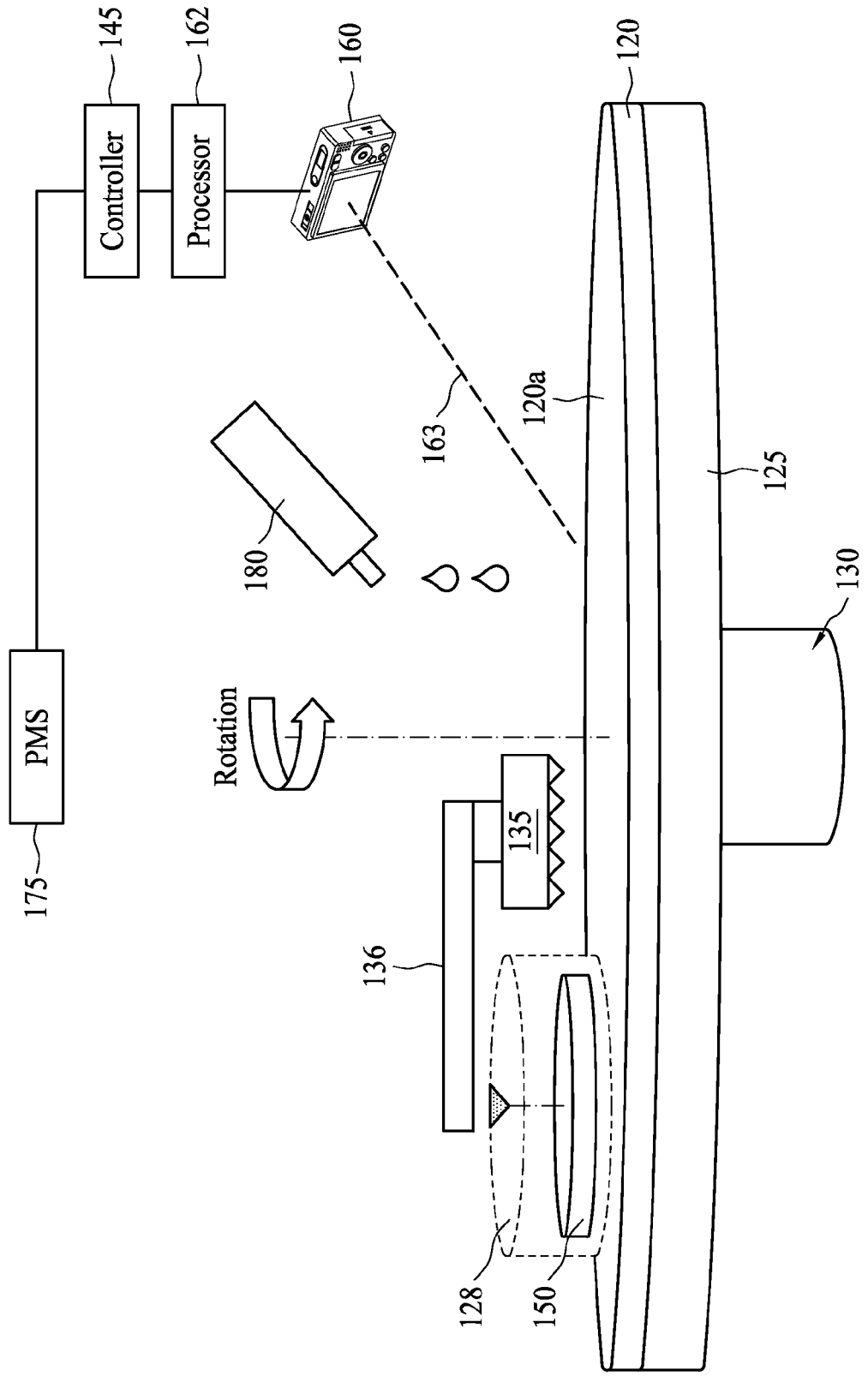
FIG. 9 is a CMP apparatus connected with a production management system for fabricating a semiconductor wafer in accordance with some embodiments of the present disclosure.

FIG. 8 is a flow chart of a method 500 for fabricating a semiconductor wafer with a CMP apparatus 100 in FIG. 1 connected to a production management system (PMS) 175 as in FIG. 9 in accordance with some embodiments of the present disclosure.

The method 500 includes several operations and some of the operations can be skipped in certain embodiments. For simplification, an operation with a same number as described in the aforementioned embodiments will not be repeated herein. In operation 501, a post CMP thickness of a remaining film on a wafer is measured by a metrology tool. The wafer is polished by the apparatus 100.

In operation 503, the post CMP thickness is transferred from the metrology tool to the PMS 175. The PMS 175 is a processor associated to CMP apparatus 100. In some embodiments as in FIG. 9, the PMS 175 is connected with controller 145.

In operation 505, the PMS 175 compares the received mean value of the remaining film thickness with a predetermined specification recorded in the PMS 175. If the mean value is greater than the value in the predetermined specification, the PMS 175 transmits a command to the controller 145. The controller 145 of apparatus 100 performs a flow starting from operation 202 through operation 208 to detect the roughness condition of pad 120.

Figure 10:
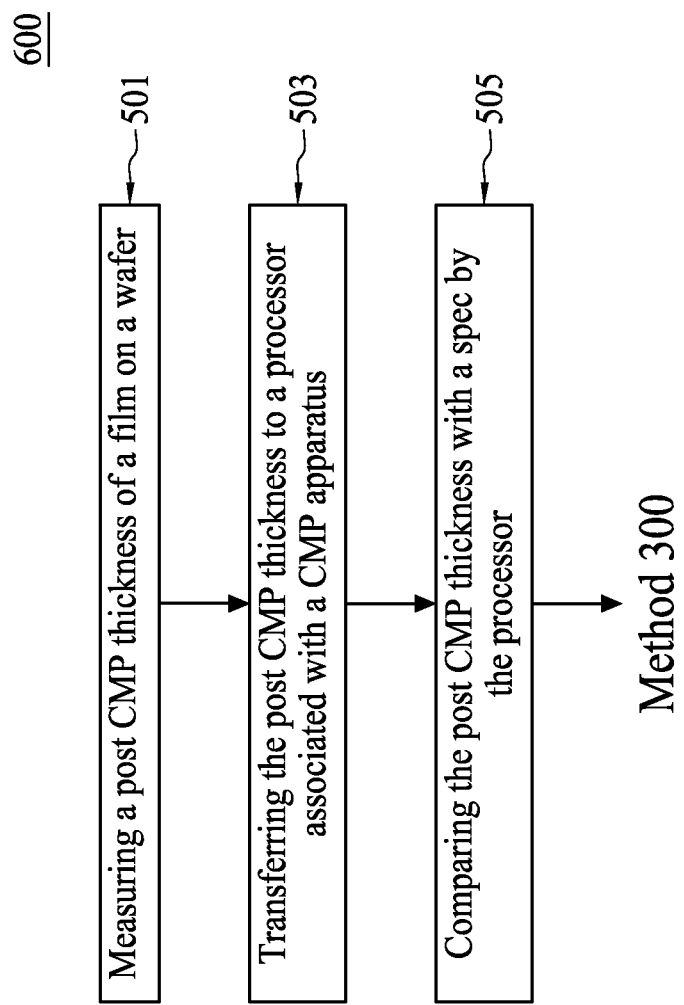
FIG. 10 is a flow chart of a method for fabricating a semiconductor wafer with a CMP apparatus as in FIG. 9 in accordance with some embodiments of the present disclosure.

In some embodiments as method 600 in FIG. 10, operations in method 300 are performed after operation 503. The whole surface area of pad 120 in apparatus 100 is conditioned to increase the roughness condition in order to improve the average polish rate.

Figure 11:
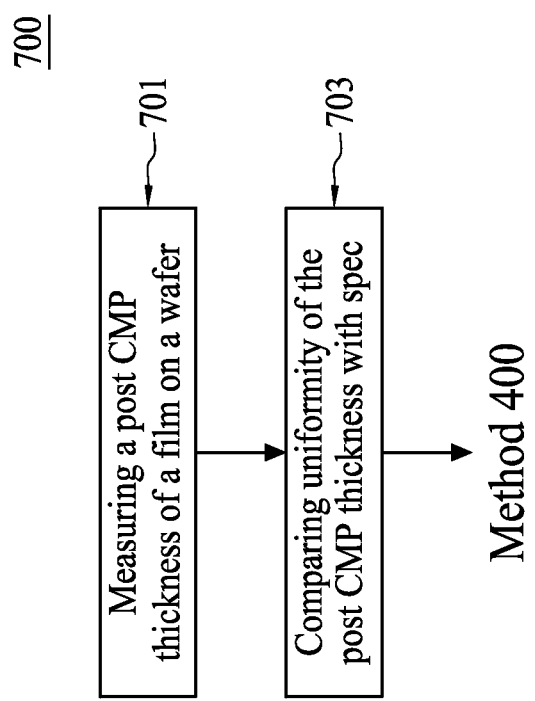
FIG. 11 is a flow chart of a method for fabricating a semiconductor wafer with a CMP apparatus as in FIG. 9 in accordance with some embodiments of the present disclosure.

FIG. 11 is a flow chart of a method 700 for fabricating a semiconductor wafer with a CMP apparatus 100 in FIG. 1 connected to a production management system (PMS) 175 as in FIG. 9 in accordance with some embodiments of the present disclosure.

The method 700 includes several operations and some of the operations can be skipped in certain embodiments. For simplification, an operation with a same number as described in the aforementioned embodiments will not be repeated herein. In operation 701, a post CMP thickness of a remaining film on a wafer is measured by a metrology tool. The uniformity of the post CMP thickness is transferred from the metrology tool to the PMS 175.

In operation 703, the PMS 175 compares the received thickness uniformity of the remaining film thickness with a predetermined specification recorded in the PMS 175. If the thickness uniformity is greater than the value in the predetermined specification, the PMS 175 transmits a command to the controller 145. The controller 145 of apparatus 100 performs the method 400 to recondition a localized zone on the pad surface 120a to improve the uniformity of polish rate.

Therefore, the PMS 175 and the apparatus 100 forms a loop to continuously feedback in-line post CMP thickness back to the apparatus 100. The apparatus 100 dynamically detects the surface roughness of pad 120 and reconditions the surface 120a as needed. There is no additional tool down time required to conduct a pad surface roughness measurement. Quality of post CMP thickness control is also improved.

In some embodiments, a semiconductor manufacturing method includes several operations. One operation is catching an image of a predetermined location on a surface of a pad installed in a chemical mechanical polishing (CMP) apparatus by a surface detector. One operation is transferring the image of the predetermined location to a processor. One operation is calculating a surface roughness value of the predetermined location from the image. One operation is comparing the surface roughness value with a threshold value by the processor to determine if the surface roughness condition at the predetermined location is smaller than the threshold value, and the surface is configured for polishing a to-be-polished surface of a wafer.

In some embodiments, the method includes dispensing slurry on the predetermined location if the surface roughness value at the predetermined location is smaller than the threshold value.

In some embodiments, the method includes contacting the predetermined location on the surface with a conditioner if the surface roughness value at the predetermined location is smaller than the threshold value.

In some embodiments, the detecting the roughness condition includes emitting an incident light to the predetermined location and scanning an area of the predetermined location by the emitted light.

In some embodiments, the catching the image of the predetermined location includes collecting an optical signal, the optical signal includes a reflection from the predetermined location after receiving the incident light.

In some embodiments, the method includes converting the optical signal to an electrical signal.

In some embodiments, the processor further determines a slurry flow dispensed on the predetermined location according to the surface roughness value of the predetermined location.

In some embodiments, the method includes determining a time of conditioning the predetermined location according to the surface roughness value of the predetermined location.

In some embodiments, a semiconductor manufacturing method includes several operations. One operation is measuring a post CMP thickness of a remaining film on a wafer. One operation is transferring the post CMP thickness to a processor associated with the CMP apparatus. One operation is comparing the post CMP thickness with a spec by the processor. One operation is detecting the roughness condition of a pad on the CMP apparatus if the post CMP thickness is greater than a spec.

In some embodiments, the method includes measuring a roughness of the polish pad and calculating a roughness value of the polish pad.

In some embodiments, the method includes comprising calculating a uniformity of the post CMP thickness.

In some embodiments, the method includes comparing a uniformity of the post CMP thickness with a spec.

In some embodiments, the method includes adjusting surface roughness value of the pad if the post CMP thickness is greater than a spec.

In some embodiments, the method includes calculating roughness condition of the predetermined location by a processor of a CMP apparatus from an image caught by an image detector of the CMP apparatus.

In some embodiments, the method includes adjusting a localized roughness of a localized zone been identified.

In some embodiments, the method includes identifying a localized zone contributing a high uniformity of a roughness value on a pad of a CMP apparatus.

A semiconductor manufacturing apparatus includes a pad for chemical mechanical polishing (CMP) a semiconductor wafer; a surface detector installed adjacent to the pad and configured to measure a surface profile of the pad; a processor coupled with the detector and configured to calculate a roughness value of the pad according to the surface profile measured by the surface detector; and a conditioner associated with the processor and configured to rough a predetermined zone of the pad.

In some embodiments, the apparatus further includes a slurry nozzle configured to dispense slurry on the predetermined zone of the pad.

In some embodiments, the surface detector includes a light emitter configured to emit a light on the pad.

In some embodiments, the apparatus further includes a controller coupled with the processor, wherein the controller is configured to command the conditioner.

Moreover, the scope of the present application is not intended to be limited to the particular embodiments of the process, machine, manufacture, and composition of matter, means, methods and steps described in the specification. As those skilled in the art will readily appreciate form the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, and compositions of matter, means, methods or steps. In addition, each claim constitutes a separate embodiment, and the combination of various claims and embodiments are within the scope of the invention.

What is claimed is:

1. A semiconductor manufacturing method, comprising:
defining at least two different predetermined locations on a surface of a pad installed in
a chemical mechanical polishing (CMP) apparatus:
emitting an incident light to a predetermined location on a surface of a pad installed in a chemical mechanical polishing (CMP) apparatus by a surface detector;
catching an image of each predetermined location by a surface detector; transferring the image of each predetermined location to a processor; calculating a surface roughness value of each predetermined location from the image; and comparing the surface roughness value with a threshold value by the processor to determine if the surface roughness condition at each predetermined location is smaller than the threshold value, wherein the surface is configured for polishing a to-be-polished surface of a wafer, wherein the calculating the surface roughness value of each predetermined location from the image comprises:

calculating a localized roughness average (LRa) of each predetermined location according to the image of each predetermined location to obtain at least two LRas, calculating a roughness uniformity according to the at least two LRas, wherein the roughness uniformity is $$\frac{\text{Max}(LRa) - \text{Min}(LRa)}{\text{Mean}(LRa)} \times 100\%,$$

the Max(LRa) being a greatest LRa among the at least two LRas, the Min(LRa) being a smallest LRa among the at least two LRas, the Mean(LRa) being a mean value of the at least two LRas.

2. The method of claim 1, further comprising dispensing slurry on a predetermined location of the at least two different predetermined locations if the surface roughness value at the predetermined location is smaller than the threshold value.

3. The method of claim 1, further comprising contacting a predetermined location of the at least two different predetermined locations on the surface with a conditioner if the surface roughness value at the predetermined location is smaller than the threshold value.

4. The method of claim 1, wherein the catching the image of each predetermined location includes collecting an optical signal, the optical signal including a reflection from each predetermined location.

5. The method of claim 1, wherein the processor further determines a slurry flow to be dispensed on each predetermined location according to the surface roughness value of each predetermined location.

6. The method of claim 1, further comprising determining a time of conditioning each predetermined location according to the surface roughness value of each predetermined location.

7. A semiconductor manufacturing apparatus, comprising: a pad for chemical mechanical polishing (CMP) a semiconductor wafer; a surface detector installed adjacent to the pad and configured to measure a surface profile of at least two different predetermined zones on a surface of the pad, the surface detector including a light emitter configured to emit a light on the pad;

a processor coupled with the detector and configured to calculate a roughness value of the pad according to the surface profile measured by the surface detector; and a conditioner associated with the processor and configured to rough each predetermined zone of the pad, wherein the processor is configured to calculate a localized roughness average (LRa) of each predetermined zone according to the surface profile of each predetermined zone to obtain at least two LRas, wherein the processor is configured to further calculate a roughness uniformity according to the at least two LRas, wherein the roughness uniformity is $$\frac{\text{Max}(LRa) - \text{Min}(LRa)}{\text{Mean}(LRa)} \times 100\%,$$

the Max(LRa) being a greatest LRa among the at least two LRas, the Min(LRa) being a smallest LRa among the at least two LRas, the Mean(LRa) being a mean value of the at least two LRas.

8. The apparatus of claim 7, further comprising a slurry nozzle configured to dispense slurry on each predetermined zone of the pad.

9. The apparatus of claim 8, wherein a specified volume of the slurry is dispensed on each predetermined zone according to the roughness value of each predetermined zone calculated.

10. The apparatus of claim 9, wherein each predetermined zone is on one of a plurality of circles concentric to a center of the pad.

11. The apparatus of claim 7, wherein the conditioner is configured to rough a predetermined zone of the at least two different predetermined zones of the pad when the surface roughness value at the predetermined zone is smaller than the threshold value.

12. The apparatus of claim 7, wherein the surface detector includes a charge coupled device (CCD), a confocal laser scanning microscopy (CLSM) or a vertical scanning optical interferometry (VSOI) to catch an image of the pad.

13. The apparatus of claim 8, wherein the processor determines a slurry flow dispensed on each predetermined zone according to the roughness value of each predetermined zone.

14. The apparatus of claim 13, wherein the processor controls the slurry nozzle according to the slurry flow.

* * * * *